(12) United States Patent
Yagyu (10) Patent No.: US 6,591,390 B1
(45) Date of Patent: Jul. 8, 2003

(54) CRC-BASED ADAPTIVE HALTING TURBO DECODER AND METHOD OF USE

(75) Inventor: Mitsuhiko Yagyu, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/547,815

(22) Filed: Apr. 11, 2000

(51) Int. Cl.[7] .................. H03M 13/29; H03M 13/45
(52) U.S. Cl. .................. 714/755; 714/756; 714/780
(58) Field of Search .................. 714/755, 756, 714/780

(56) References Cited

U.S. PATENT DOCUMENTS

| | | | |
|---|---|---|---|
| 5,761,248 A | * | 6/1998 | Hagenauer et al. ......... 375/340 |
| 6,065,147 A | * | 5/2000 | Pyndiah et al. ............. 714/755 |
| 6,182,261 B1 | * | 1/2001 | Haller et al. ................ 714/758 |

OTHER PUBLICATIONS

A. Shibutani et al., "Reducing Average Number of Turbo Decoding Iterations", Electronics Letters, Apr. 29, 1999, vol. 35, No. 9, pp. 701–702.*

Leung, Oliver Yuk–Hang, et al., "Reducing Power Comsumption of Turbo Code Decoder Using Adaptive Iteration with Variable Supply Voltage", Proc. 1999 International Symposium on Low Power Electronics and Design, Aug. 16–17, 1999, San Diego CA, pp. 36–41.*

"Near Shannon Limit Error—Correcting Coding and Decoding: Turbo–Codes (1)," IEEE, 1993, pp. 1064–1070 (Claude Berrou; Alain Glavieux and Punya Thitimajshima).

"Iterative Decoding of Binary Block and convolutional Codes," IEEE Transacation on Information, Theory, vol. 42, No. 2, Mar. 1996, pp. 429–445 (Joachim Hagenauer; Elke Offer and Lutz Papke).

"Illuminating the Structure of Code and Decoder of Parallel Concatenated Recursive Systematic (Turbo) Codes," 1994 IEEE, pp. 1298–1303 (Patrick Robertson).

"Two Simple Stopping Criteria for Turbo Decoding," IEEE Transactions on Communications, vol. 47, No. 8, Aug. 1999, pp. 1117–1120 (Rose Y. Shao; Shu Lin and Marc P.C. Fossorier).

"On the Design of Turbo Codes," TDA Progress Report 42–123, Nov. 15, 1995, pp. 99–121 (D. Divsalar and F. Pollara).

"Complexity Reduction of Turbo Decoding," IEEE, VCT 1999, pp. 1570–1574 (Akira Shibutani; Hirohito Suda and Fumiyuki Adachi).

"Iterative Decoding and Despreading Improves CDMA–Systems Using M–ary Orthogonal Modulation and FEC," 1997 IEEE, pp. 909–913 (Rupert Herzog; Andreas Schmidbauer and Joachim Hagenauer).

"A Comparison of Optimal and Sub–Optimal MAP Decoding Algorithms Operating in the Log Domain," 1995 IEEE, pp. 1009–1013 (Patrick Robertson; Emmanuelle Villebrun and Peter Hoeher).

* cited by examiner

*Primary Examiner*—Stephen M. Baker
(74) *Attorney, Agent, or Firm*—Carlton H. Hoel; W. James Brady; Frederick J. Telecky, Jr.

(57) ABSTRACT

A CRC-based adaptive halting turbo decoder applies a CRC code to identify internally generated information sequences. The information sequences are encoded with the CRC code and can be substantially identified by only the parity part. New information sequences are generated during each iteration and used to estimate the state of the convergence. The CRC-based adaptive halting turbo decoder is halted when the information sequences generated in two contiguous iterations produce identical parity bits. Memory storage requirements for the adaptive halting are reduced since only the parity bits are stored.

29 Claims, 3 Drawing Sheets

CRC-BASED ADAPTIVE HALTING TURBO DECODER AND METHOD OF USE

RELATED PATENT APPLICATIONS

This application is related to co-filed U.S. Patent Application entitled Direct Comparison Adaptive Halting Decoder and Method of Use, application Ser. No. 09/547, 382.

BACKGROUND OF THE INVENTION

1. Field of the Invention

This invention relates generally to iterative turbo decoding, and more particularly to adaptive halting algorithms that reduce computational complexity of iterative turbo decoders.

2. Description of the Prior Art

Turbo code is well known computational tool that was proposed in 1993 and that attracted the attention of researchers and developers, especially in the art of communication engineering. C. Berrou, A. Glavieux, and P. Thitimajshima, Near Shannon Limit Error-correcting Coding and Decoding: Turbo Codes (I), Proc.ICC '93, pp. 1064–1070, May 1993. The Berrou et al. reference is incorporated by reference herein. A turbo encoder is composed of two recursive systematic convolutional (RSC) encoders and an interleaver to generate the interleaved version of an input information sequence. The interleaved sequence is also encoded using one of the RSC encoders. The resultant turbo code, using parallel concatenation of the two RSC codes, has a substantially large free Hamming distance and therefore provides a powerful error correcting code. The aforesaid Hamming distance can be further improved by employing long interleavers a the expense of larger memory capacity.

Figure 4:
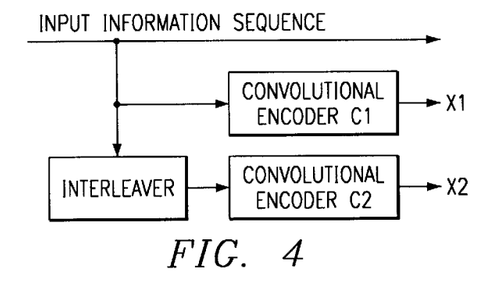
FIG. 4 is a simplified block diagram of a parallel-concatenated turbo encoder for rate 1/3.

FIG. 4 is a simplified block diagram of a parallel-concatenated rate 1/3 turbo encoder. A parallel-concatenated turbo encoder has two or more component encoders in conjunction with one or more interleavers. A component encoder C1 to create a parity sequence X1 encodes an input information sequence. The input information sequence is interleaved and then encoded by C2 to create a second parity sequence X2. The information sequence and two parity sequences are then multiplexed to create a coded sequence.

The foregoing two RSC codes are alternately MAP-decoded in the turbo decoder, and the reliability of the soft output of the MAP decoder is iteratively updated. The sign of the soft output is improved as a decoded output following a sufficient number of iteration steps. The amplitude of the soft output gradually increases during the iteration process. However, the sign generally remains constant after several iteration steps. Thus, it is easy to recognize a decoded output can become error-free in just a few iteration steps for low-noise channels having a channel-decoded bit error rate (BER) as low as $10^{-6}$. Detection of an error-free decoded sequence can significantly reduce computational complexity since the iteration process can then be halted without requiring further iteration computations.

A transmitted sequence is generally encoded with an error detection code such as the familiar cyclic redundancy check (CRC) code disclosed by S. Lin and D. J. Costello Jr., *Error Control Coding: Fundamentals and Applications*, Prentice Hall, New Jersey, 1983, and incorporated herein by reference. The above error-free decoding can then be checked for accuracy at the receiver side using the CRC code; and when error-free decoding is detected during an iteration, the remaining portion of the iteration can either be ignored or completely halted. A. Shibutani, H. Suda, and F. Adachi, *Decoding-complexity Reduction On Turbo-CRC Concatenated Code in W-CDMA Mobile Radio*, Proc. IEICE General Conf., B-5-109, vol. 1, pp. 541, March 1999 (in Japanese), and incorporated by reference herein, have shown the effectiveness of the foregoing iterative turbo decoding process.

If a transmitted sequence is not encoded with the CRC code, the foregoing technique of Shibutani et al. cannot be applied however. Even if the transmitted sequence is encoded with the CRC code, the associated receiver decoder must a priori know the generator polynomial of the CRC code and the position of its redundancy check words in the received sequence. This limitation makes the design of the decoder complicated for variable rate data communications.

In J. Hagenauer, E. Offer, and L. Papke, *Iterative Decoding of Binary Block and Convolutional Codes*, IEEE Trans. Inf. Theory, vol. 42, pp. 429–445, March 1996 and in U.S. Pat. No. 5,761,248, entitled Method and Arrangement for Determining an Adaptive Abort Criterion in Iterative Decoding of Multi-dimensionally Coded Information, by J. Hagenauer and F. Burkert, issued June 1998, both references incorporated herein by reference, Hagenauer et al. have shown implementation of the adaptive halting algorithm without resorting to use of the transmitted CRC code. The adaptive halting algorithm of Hagenauer et al. makes use of the difference sequence between two soft output sequences determined at the iteration step as well as the preceding iteration step and derived at each iteration step. Then the $L_2$ norm of the difference sequence (cross entropy of the two soft output sequences) is calculated at each iteration step. Once the cross entropy of the two soft output sequences becomes less than a predetermined threshold value, the iteration process is halted. Although the techniques developed by Hagenauer et al. do not require use of the transmitted CRC code, the technique otherwise requires an extra large memory capacity to store the soft output sequence data at each preceding iteration step. This is so since the soft output sequence of a typical turbo decoder is very long and therefore has soft output symbols with long word lengths. Further, the aforementioned cross entropy needs to be computed using high accuracy in order to accurately detect the convergence of iterative decoding, which significantly increases the hardware size of the multiplier used for the calculation of the $L_2$ norm.

P. Robertson, Illuminating the Structure of Parallel Concatenated Recursive Systematic (TURBO) Codes, Proc. GLOBECOM'94, pp. 1298–1303, November 1994, incorporated by reference herein, proposes application of the adaptive halting algorithm using the variance of the soft output sequence as the halting criterion. Although the Robertson technique does not require an extra large memory capacity or a large multiplier such as required when using the foregoing cross entropy computation methods, the technique of Robertson nonetheless requires a multiplier to calculate the variance. The requirement for a multiplier is disadvantageous for low power and low-cost silicon implementations since the additional hardware will increase both the size and power requirements necessary to implement the adaptive halting algorithm.

In view of the foregoing, a need exists in the communication art for an adaptive halting structure and method that does not require use of the passively embedded CRC code and that does not require surplusage multipliers or memory capacity.

SUMMARY OF THE INVENTION

The present invention is directed to a structure and method of implementing an adaptive halting algorithm (CRC-based comparison algorithm) associated with iterative turbo decoding without resorting to use of a passively included CRC code in the transmitted information sequence. As used herein, CRC means cyclic redundancy check. The soft output sequence observed at each iteration step contains information on three L-valued sequences; the channel information sequence, the a priori information sequence and the extrinsic information sequence. The channel information sequence is constant during the iteration and thus does not have any information on the state of the convergence necessary to halt the iteration process. Thus, the change of the sum of the a priori information sequence and the extrinsic information sequence is observed during each iteration step. The soft output sequence containing the channel information sequence is, however, referred to in order to estimate the state of the convergence, such as disclosed by Hagenauer et al. above. The sum of the a priori information sequence and the extrinsic information sequence contains accurate information on the state of the convergence and thus is quantized into a binary sequence. During an iteration, any changes of the binary sequence are detected. The iteration process is halted once this change can no longer be detected. The foregoing detection at each iteration step can be easily implemented by using a CRC code defined only at the decoder, which does not seriously increase the hardware size of the decoder.

The present iterative turbo decoding process utilizing the CRC-based comparison algorithm is implemented by further dividing each iteration step into two stages. MAP-decoding is performed at each stage of the iteration step. The MAP-decoding produces informative sequences at each stage that are then subsequently summed and quantized into binary sequences (reference sequences). The pair of reference sequences is compared with the respective pair of reference sequences generated in the previous iteration step. The iteration process is then halted only if the reference sequences at the first and the second stages of the iteration step correspond identically with those same reference sequences generated at the preceding iteration step. Using a CRC code defined by the decoder makes the comparison.

As used herein, the following words have the following meanings. The words "algorithmic software" mean an algorithmic program used to direct the processing of data by a computer or data processing device. The words "data processing device" as used herein refer to a CPU, DSP, microprocessor, micro-controller, or other like device and an interface system. The interface system provides access to the data processing device such that data could be entered and processed by the data processing device. The words "discrete data" as used herein are interchangeable with "digitized data" and "digitized data" as used herein means data which are stored in the form of singularly isolated, discontinuous data or digits. The word "interleaver" as used herein means a single input, single output device that takes sequences of symbols in a fixed alphabet and produces an output sequence of the identical symbols over the same alphabet in a different temporal order. Then for an input sequence $x_i$, $i \in Z$ to an interleaver, the output sequence $y_i$, $i \in Z$ can be written as $y_i = x_{\pi(i)}$, where $\pi$ is defined as an invertible function: $\pi: Z \rightarrow Z$.

In one aspect of the invention, a method and associated structure are implemented to provide a CRC-based adaptive halting algorithm associated with iterative turbo decoding to more efficiently estimate the state of the convergence for a variable rate data communication signal.

In still another aspect of the invention, a method and associated structure are implemented to provide a CRC-based adaptive halting algorithm associated with iterative turbo decoding to estimate the state of the convergence of received communication signals devoid of passively embedded error detection, e.g. CRC, codes.

In yet another aspect of the invention, a method and associated structure are provided to implement a CRC-based adaptive halting algorithm associated with iterative turbo decoding to estimate the state of the convergence of a data communication signal without the necessity of direct reference to soft output sequences.

In another aspect of the invention, a method and associated structure are provided to implement a CRC-based adaptive halting algorithm associated with iterative turbo decoding to estimate the state of the convergence of a data communication signal without requiring either a large memory capacity or a multiplier with a long word length.

Another aspect of the invention is associated with a CRC-based adaptive halting algorithm iterative turbo decoding procedure and structure in which the computational complexity of the decoder(s) can be reduced by about 50% over known iterative turbo decoder structures without degradation in the BER and FER, to estimate the state of the convergence of a data communication signal.

Still another aspect of the invention is associated with a CRC-based adaptive halting algorithm iterative turbo decoding procedure and structure in which the hardware sizes of the CRC decoder(s), the comparator(s) and the register(s) are insignificant in comparison with those of the MAP decoder(s) and the interleaver(s) of known turbo decoders.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
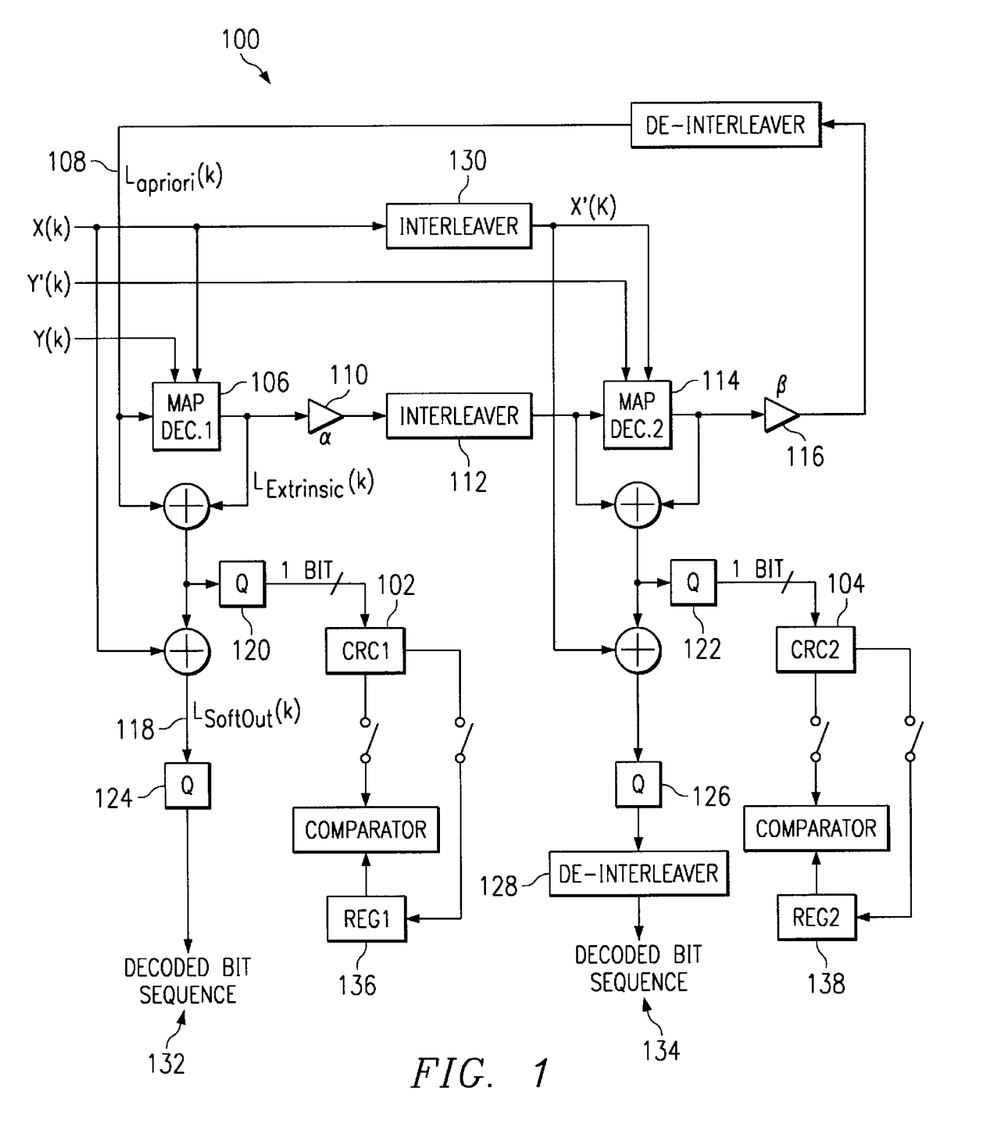
FIG. 1 illustrates a turbo decoder structure suitable for implementing adaptive halting algorithms having CRC codes defined by the decoder(s) in accordance with one preferred embodiment of the present invention.

FIG. 1 illustrates a turbo decoder structure 100 suitable for implementing adaptive halting algorithms having a CRC code defined by the decoders 102, 104 in accordance with one preferred embodiment of the present invention. A rate 1/3 turbo coding associated with one systematic code sequence and two convolutional code sequences are considered herein to describe the present embodiments. The present invention is not so limited however, and it shall be understood that while a rate 1/3 turbo to coding is considered herein, such rate is considered for illustration purposes only and to better explain a particular method and structure in accordance with one preferred embodiment of the present invention. The two convolutional code sequences are presumed to be generated in a transmitter (not shown), by convolving the input and its interleaved sequences in parallel such that the output symbols are recursively determined. Generally, a decoder (discussed more fully below) receives the transmitted sequences as received sequences and re-constructs the original data source bit stream from the received data elements, which may have been corrupted by noise.

The present invention may be implemented in hardware or software, or a combination of both. In a preferred embodiment, the functions of a turbo decoder designed in conformance with the principles set forth herein are implemented as one or more integrated circuits using a suitable processing technology, e.g., CMOS.

As another example, the present invention may be implemented in computer programs, i.e. algorithms, executing on programmable computers each comprising a data processor, a data storage system, including both volatile and non-volatile memory and/or data storage devices, at least one input device, and at least one output device. Program code is applied to input data to perform the functions described herein and generate output information. The output information is applied to one or more output devices, in known fashion. Each such program may be implemented in a high level procedural or object oriented programming language to communicate with a computer system. However, the programs can be implemented in assembly or machine language, if desired. In any case, the language may be a compiled or interpreted language. Each such computer program is preferably stored on a storage media or device, e.g. ROM or magnetic disk) readable by a general or special purpose programmable computer, for configuring and operating the computer when the storage media or device is read by the computer to perform the procedures described herein. The inventive structure and methods may also be considered to be implemented as a computer-readable storage medium, configured with a computer program, where the storage medium so configured causes a computer to operate in a specific and predefined manner to perform the functions described herein. An example of one such type of computer is a personal computer.

Looking again at FIG. 1, X(k) represents the received noisy systematic sequence that contains the channel information. Y(k) and Y'(k) represent the two noisy convolutional code sequences corresponding to the input information sequence and its interleaved sequence respectively. The component k represents the time index for the symbol of the foregoing noisy sequences. The present method of turbo decoding is performed as iterative decoding in which each iteration step is further divided into two stages. Each of the two stages of iterative decoding is associated with a designated portion of the turbo decoder structure 100, e.g. MAP Dec. 1, 2; CRC 1, 2; Reg1, 2. The noisy systematic sequence X(k) and Y(k) are decoded in the first stage of the iteration step via MAP-Dec. 1 decoder 106 using the a priori information sequence $L_{apriori}(k)$ 108 generated in the second stage of the preceding iteration step. This MAP-decoder 106 then generates the extrinsic information sequence $L_{Extrinsic}(k)$. The generated extrinsic information sequence $L_{Extrinsic}(k)$ is scaled via scaler 110 and interleaved via interleaver 112 to generate a new a priori information sequence for the second stage of the iteration step. The new a priori information sequence for the second stage of the iteration step as well as the interleaved channel information sequence and the convolutional code sequence Y'(k) are then used in the MAP-Dec.2 decoder 114 to implement the requisite MAP-decoding to generate the extrinsic information sequence thereby formulating the α priori information sequence in the following iteration step. The scaling factors α and β associated with scalers 110, 116 respectively, are changed at each iteration step using techniques familiar to those skilled in the art of iterative turbo decoding, and have values pre-optimized to speed up the convergence of the iterative decoding and to reduce the BER. These scaling factors are empirically determined and less than or equal to 1. A more detailed discussion of the scaling factors can be found in D. Divsalar and F. Pollara, *On the Design of Turbo Codes*, TDA Progress Report, 42:123, Jet Propulsion Lab., Pasadena, Calif., pp. 99–121, November, 1995 and the Berrou et al. reference discussed herein above. Both references are incorporated by reference herein. Further, scaling factors of 1.0 generally achieve sufficiently good BER performance if the MAP decoder(s) is implemented by the full algorithm disclosed in L. R. Bahl, J. Cocke, F. Jelinek, and J. Raviv, *Optimal Decoding of Linear Codes for Minimizing Symbol Error Rate*, IEEE Trans. Inf. Theory, vol. IT-20, pp. 284–287, March, 1974, incorporated by reference herein. However, Berrou et al. have shown that when a large number of iterations are carried out, the scaling factors are often given as values slightly less than 1.0, i.e. 0.98. Scaling factors less than 1.0 are effective to reduce bit error rates, especially for the Max Log-MAP algorithm, the soft output Viterbi algorithm and the like. Unless the scaling factors have values far smaller or larger than 1.0, turbo decoders keep BER performance without degradation; and halting criteria for the turbo decoding do not degrade the BER performance.

A discussion directed to MAP-decoders, the a priori information sequence and the extrinsic information sequence are set forth immediately herein below to provide additional background directed to a better understanding of the instant embodiment of the present invention. First, the log likelihood ratio L(X) for a random variable $X\in\{1,-1\}$ is defined as $$L(X) = \log\frac{P(X = +1)}{P(X = -1)}, \quad\quad 1)$$

in agreement with Hagenauer et al., where P(X=±1) denotes the probability that the random variable X takes on the values +1 and −1, respectively. Then using $$P(X=+1)+P(X=-1)=1, \quad\quad 2)$$

$$P(X = \pm 1) = \frac{e^{\pm L(X)}}{1 + e^{\pm L(X)}}. \quad\quad 3)$$

Further, a rate 1/2 systematic convolutional code is now also used as an example. An information sequence is then defined as $u=[u_1, u_2, \ldots, u_N]$, $u_k \in \{1, -1\}$ for $k=1, \ldots, N$, and a corresponding code word vector is defined as $c(u)=[c_1(u), c_2(u), \ldots, c_{2N}(u)]$, $c_n(u) \in \{1, -1\}$ for $n=1, \ldots 2N$. The set of all possible information sequences is further identified as U and an observation vector of the code word through an AWGN channel corresponding to the information sequence is defined as $v=[v_1, v_2, \ldots, v_{2N}]$. The MAP decoder has two inputs, i.e. the apriori information sequence and the observation vector, and two outputs, i.e. the soft output sequence and the extrinsic information sequence. The apriori information sequence $L_{apriori}(k)$ for $k=1, \ldots, N$ is defined as the scaled extrinsic information sequence which is one of the previous outputs of the MAP decoder of the turbo decoder. Then by using a given apriori information sequence and observation, the MAP decoder computes the soft output sequence and the extrinsic information sequence. The soft output sequence is defined as $$L_{SoftOut}(k) = \log \frac{\sum_{u \in U, u_k = +1} \left( \prod_{j=1}^{2N} p(v_j | c_j(u)) \prod_{j=1}^{N} P(u_j) \right)}{\sum_{u \in U, u_k = -1} \left( \prod_{j=1}^{2N} p(v_j | c_j(u)) \prod_{j=1}^{N} P(u_j) \right)}, \quad (4)$$

where $$P(u_j = \pm 1) = \frac{e^{\pm L_{apriori}(j)}}{1 + e^{\pm L_{apriori}(j)}} \quad (5)$$

and $$p(v_j | c_j(u)) = \frac{1}{\sqrt{\pi N_0}} e^{-\frac{(v_j - c_j(u))^2}{N_0}}. \quad (6)$$

Note that $E_s$ of the observation vector is assumed to be 1.0. Further, $v_n'$ is defined to be the observation of the systematic code bit $c_n'(u)$ corresponding to the information bit $u_k$. The extrinsic information sequence is then defined as $$L_{Extrinsic}(k) = L_{SoftOut}(k) - L_{apriori}(k) - X(k), \quad (7)$$

where $$X(k) = \log \frac{\exp\left(-\frac{(v_n' - 1)^2}{N_0}\right)}{\exp\left(-\frac{(v_n' + 1)^2}{N_0}\right)} = \frac{4}{N_0} v_n'. \quad (8)$$

The extrinsic information sequence is then scaled, interleaved and used as the apriori information sequence in the next MAP decoding. The scaling factor is generally equal to or slightly less than 1, as discussed herein before.

The soft output sequence, e.g. $L_{SoftOut}(k)$ 118, associated with either stage of each iteration step can be seen to be produced by adding the three sequences; the a priori information sequence, the channel information sequence and the extrinsic information sequence. Each soft output sequence, e.g. $L_{SoftOut}(k)$ 118, is quantized into one bit via a respective quantizer 124, 126, to generate a binary sequence that corresponds to the decoded sequence in the first stage of the iteration step. The decoded sequence in the second stage can be seen to be obtained by de-interleaving the quantized soft output sequence via a De-Interleaver 128 to account for the channel information sequence passing through Interleaver 130.

During the iteration taking place in the above described turbo decoding process, the amplitude of the above described soft output gradually becomes larger; and the decoded sequence often becomes error-free after a few iteration steps. The decoded sequence therefore does not change by further iteration once the decoded sequence becomes error-free. Thus, the error-free decoded sequence can be detected simply by detecting when the decoded sequence is identical to one at the preceding iteration step. Such error-free detection techniques have limitations however. For example, it is known that even the decoded sequence with errors is often unchanged through several successive iteration steps, especially in the case of turbo decoding associated with finite word length arithmetic. Application of the foregoing error-free detection technique in such circumstances would likely halt the iteration process too early, seriously degrading the BER. In view of the foregoing limitations associated with known turbo decoding structures and methods, it is important to also be able to estimate the state of the convergence during the iterative decoding process. The decoded bits 132, 134 can be seen to be generated by quantizing the soft output $L_{SoftOut}(k)$ shown as $$L_{SoftOut}(k) = X(k) + L_{apriori}(k) + L_{Extrinsic}(k). \quad (9)$$

The soft output $L_{SoftOut}+(k)$ sequence thus comprises three information sequences, the α priori information sequence, the extrinsic information sequence and the channel information sequence. The channel information sequence X(k) is constant during the to iteration process, and thus has no information on the state of the convergence. The sequence comprising $L_{apriori}(k) + L_{Extrinsic}(k)$ is therefore more informative on the state of the convergence than the soft output sequence.

The turbo decoder structure 100 can be seen to also generate the above described information sequence comprising $L_{apriori}(k) + L_{Extrinsic}(k)$ at each stage of the turbo decoder structure 100. These information sequences comprising $L_{apriori}(k) + L_{Extrinsic}(k)$ are subsequently quantized via quantizers 120 and 122 respectively to formulate binary sequences (quantized reference sequences). These quantized reference sequences at the first and second stages of the turbo decoder structure 100 and generated during an iteration step are compared with the respective reference sequences generated during a preceding iteration step. The iteration process is halted once the quantized reference sequences generated at a particular iteration step are identical to those generated at the preceding iteration step. The foregoing comparison of quantized reference sequences is achieved simply by using a CRC code defined within the turbo decoder structure 100 via the two CRC word generators CRC1 102 and CRC2 104. In the CRC word generator 102, 104, a quantized reference sequence is encoded with a specific systematic cyclic code. Then, the CRC word generator 102, 104 generates a CRC word, that is, only parity bits of the code word associated with the quantized reference sequence. Only the two CRC words associated with the two stages of the CRC-based adaptive halting turbo decoder 100 are stored within respective data storage registers 136, 138 depicted as storage register Reg1 and storage register Reg2 in FIG. 1. The present invention is not so limited however. As the CRC words have far smaller number of bits than the quantized reference sequences, the CRC words could just as easily be stored in separate and distinct storage devices or any other combination of storage locations. Thus, quantized reference sequences at both stages of the CRC-based adaptive halting turbo decoder 100 are computed and encoded with the identical CRC code in the same way during each iteration step, resulting in double redundancy. The iteration process is halted if the resultant double CRC words at a specific iteration step are identical to those at the previous iteration step.

The present method then, represents a significant advancement in the state of present art associated with adaptive halting algorithms and iterative turbo decoding structures and methods. The hardware size requirements associated with the present CRC-based adaptive halting turbo decoder 100, e.g. CRC word generators, comparators, registers and the like, are substantially insignificant in comparison with the MAP decoders and interleavers associated with known turbo decoders.

Figure 2:
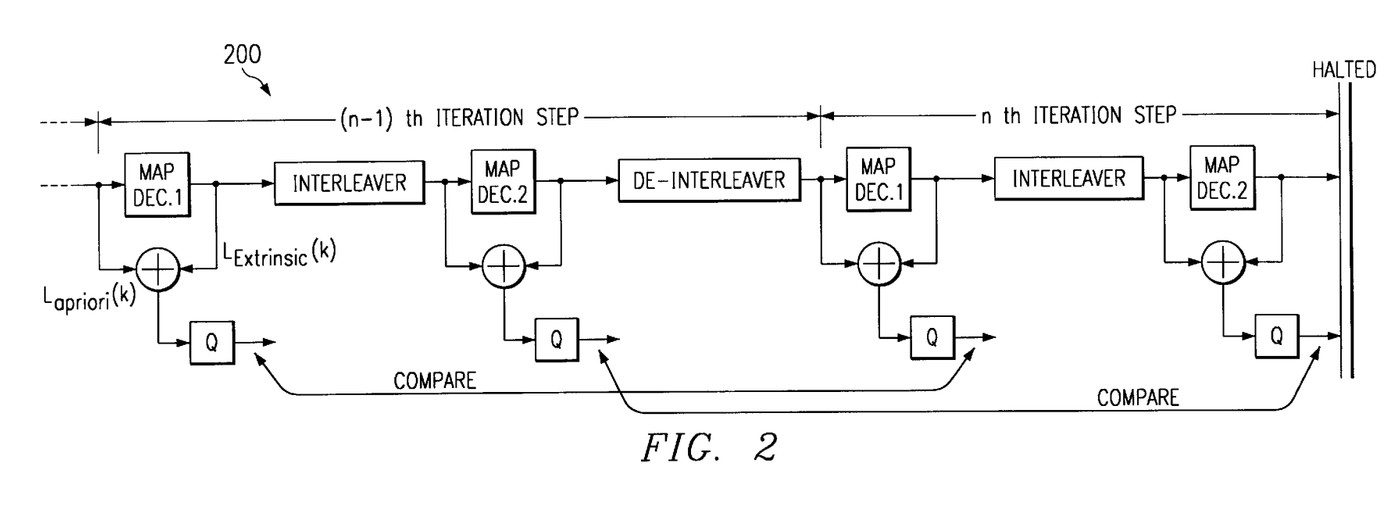
FIG. 2 is a flow diagram illustrating a CRC-based adaptive halting algorithm associated with the turbo decoder structure of FIG. 1, according to one preferred embodiment of the present invention.

FIG. 2 is a flow diagram illustrating the above described CRC-based adaptive halting algorithm 200 associated with the CRC-based adaptive halting turbo decoder 100 of FIG. 1, according to one preferred embodiment of the present invention. The state of the convergence can be seen to made through successive two iteration steps. Memory requirements associated with the CRC-based adaptive halting algorithm 200 are optimized since any reference sequences need not be stored in the memory as stated herein above.

Figure 3A:
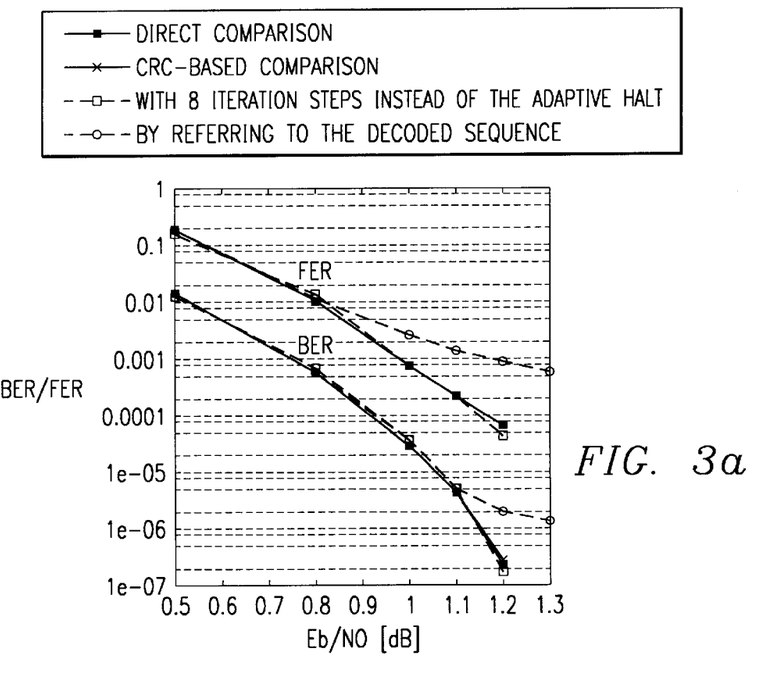
FIG. 3(a) is a graph illustrating bit error rates (BER) and forward error rates (FER) for the present method and structure, a method and structure referring to the decoded sequence, and a method and structure using 8 iteration steps without adaptive halting.

FIG. 3(a) is a graph illustrating bit error rates (BER) and forward error rates (FER) for 1) the present CRC-based adaptive halting method and structure, 2) a method and structure referring to the decoded sequence, and 3) a method and structure using 8 iteration steps without adaptive halting. The effectiveness of the present structure and method can be demonstrated by simply comparing the present structure and method with a turbo decoder using the adaptive halting algorithm in which the decoded sequence, rather than the reference sequence, is used for the halting criterion. The decoded sequence is obtained first by quantizing the soft output sequence into a binary sequence such as discussed herein above. Changes in the decoded sequence are detected by the passively embedded CRC code during the iteration, also discussed above. The above comparison used a CRC code generated via a polynomial generator common to both the present CRC-based technique and the decoded sequence technique. The polynomial generator is represented by equation (10) below.

$$x^{32}+x^{26}+x^{23}+x^{22}+x^{16}+x^{12}+x^{11}+x^{10}+x^8+x^7+x^5+x^4+x^2+1 \quad (10)$$

Further, the rate 1/3 turbo code disclosed in $3^{rd}$ Generation Partnership Project (3GPP) Technical Specification, *Physical Layer General Description*, June 1999, was used in the instant comparison. The MAP-decoding in the turbo decoder was accomplished using a finite word length via application of the Max-Log MAP algorithm disclosed by Robertson et al. in *A Comparison of Optimal and Sub-optimal MAP Decoding Algorithms Operating in the Log Domain*, Proc. ICC'95, pp. 1009–1013, June 1995. The Robertson et al. reference and the '3GPP' reference are incorporated by reference herein. The received signals X(k), Y(k) and Y'(k) were scaled and quantized into 6 bit symbols. The extrinsic information symbols and the state metrics were quantized into 9 bit symbols within the present CRC-based turbo decoder and then stored in memory. The scaling factors α and β, having finite word lengths, were changed at each iteration step with pre-optimized values to accommodate fast convergence of the iterative decoding such as discussed above. The physical layer disclosed in the $3_{rd}$ Generation Partnership Project (3GPP) Technical Specification referenced above was used to formulate a turbo encoder with eight states and an interleaver having a variable symbol length between 320 and 5120 bits. The interleaver for the above comparison had a symbol length of 1171 bits. The foregoing parameters were then used to evaluate the BER and FER of the decoder outputs at several $E_b/N_0$'s of the additive white gaussian noise channel.

The adaptive haltings via the present CRC-based adaptive halting algorithm can be seen to significantly reduce the BER and FER of the above decoder when contrasted with application of the above described decoded sequence adaptive halting algorithm. The BER and FER associated with the decoded sequence adaptive halting algorithm are seriously degraded since they have a high $E_b/N_0$ error floor. This degradation is caused due to the fact that the decoded sequence is not as informative on the state of the convergence since the decoded sequence also includes the channel information sequence that is constant during the iteration process as discussed herein before. The reference sequence, defined as the quantized version of $L_{apriori}(k)+L_{Extrinsic}(k)$, is therefore seen as sufficient to know the state of the convergence. The foregoing application of adaptive halting algorithms applied to a turbo decoder further confirms that the reference sequence can thus be utilized to accurately estimate the state of the convergence using the present CRC-based adaptive halting techniques.

Figure 3B:
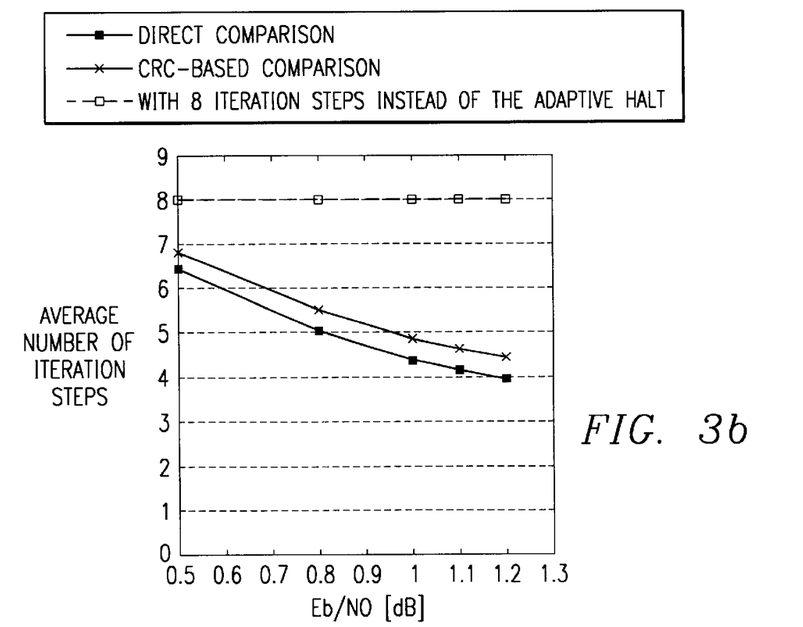
FIG. 3(b) is a graph illustrating the average number of iteration steps to convergence for the present method and structure and a method and structure using 8 iteration steps without adaptive halting.

FIG. 3(b) is a graph illustrating the average number of iteration steps to convergence for 1) the present method and structure and 2) a method and structure using 8 iteration steps without adaptive halting. The adaptive haltings via the CRC-based comparison algorithm can be seen to significantly reduce the average number of iteration steps without causing degradation in the BER and/or FER when compared with a decoder configured to complete 8 full iteration steps. A closer look at FIG. 3(b) shows that the CRC-based decoder completed its decoding process in about 4 iteration steps at $E_b/N_0$=1.2 dB. Since the 8-step decoder completed its decoding process in 8 iteration steps at $E_b/N_0$=1.2 dB, the present CRC-based adaptive halting turbo decoder 100 can be seen to require only 50% of the computational complexity of the 8-step adaptive halting decoder.

In summary explanation of the above, the present invention can accurately estimate the state of the convergence for transmitted sequences received and processed by an adaptive halting turbo decoder, even when the transmitted sequences are not encoded with error-detection codes. Because the present invention does not directly refer to any soft output sequences, memory capacity requirements are not wasted to accommodate storage of soft output sequences having long word lengths or multipliers having long word lengths. This is a substantial advantage over known structure and techniques associated with adaptive halting algorithms for iterative turbo decoding.

This invention has been described in considerable detail in order to provide those skilled in the equalizer art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular turbo decoder elements and associated characteristics, the present inventive structures and methods are not necessarily limited to a particular turbo decoder architecture or set of characteristics as used herein. Depending upon the particular application, a decoder element can mean a single element or any combination of decoder elements, so long as the present CRC-based adaptive halting can be preserved.

What is claimed is:

1. A method of iteratively decoding a sequence of received signals, representative of systematic convolutional encoded elements generated by a parallel-concatenated encoder from a source of original digital data elements, into decoded elements corresponding to the original digital data elements, the method comprising the steps of:

(a) probability-based decoding a received input information sequence x(k), a first received convolutional code sequence Y(k) corresponding to the input information sequence, and a first a priori information sequence to generate a first extrinsic information sequence;

(b) probability-based decoding an interleaved received input information sequence X'(k), a second received convolutional code sequence Y'(k) corresponding to the interleaved input information sequence, and a second a priori information sequence to generate a second extrinsic information sequence;

(c) summing the first a priori information sequence and the first extrinsic information sequence to generate a first reference sequence;

(d) quantizing the first reference sequence to generate a first quantized reference sequence;

(e) summing the second a priori information sequence and the second extrinsic information sequence to generate a second reference sequence;

(f) quantizing the second reference sequence to generate a second quantized reference sequence;

(g) CRC encoding the first quantized reference sequence to generate a first CRC word;

(h) CRC encoding the second quantized reference sequence to generate a second CRC word;

(i) storing the first CRC word and the second CRC word;

(j) probability-based decoding both a new first a priori information sequence and a new second a priori information sequence to generate a new first extrinsic information sequence and a new second extrinsic information sequence;

(k) repeating steps (c) through (h) using the new information sequences generated in step (j) to generate a new first CRC word and a new second CRC word;

(l) comparing the new first CRC word with the stored first CRC word and the new second CRC word with the stored second CRC word to determine if the stored CRC words are identical with the newly generated CRC words;

(m) repeating steps (i) through (l) using the new first CRC word and the new second CRC word until the compared CRC words are identical; and (n) generating substantially error-free decoded elements when the compared CRC words are identical.

2. The method of iteratively decoding a sequence of received signals according to claim 1 further comprising the step of scaling and interleaving the first extrinsic information sequence to generate the second a priori information sequence.

3. The method of iteratively decoding a sequence of received signals according to claim 1 further comprising the step of scaling and de-interleaving the second extrinsic information sequence to generate the first a priori information sequence.

4. The method of iteratively decoding a sequence of received signals according to claim 1 wherein the step (n) of generating substantially error-free decoded elements when the compared CRC words are identical comprises the step of summing and then quantizing the received input information sequence X(k) and the first reference sequence to generate a first SoftOut information sequence.

5. The method of iteratively decoding a sequence of received signals according to claim 4 wherein the step (n) of generating substantially error-free decoded elements when the compared CRC words are identical further comprises the step of summing and then quantizing the interleaved received input information sequence X'(k) and the second reference sequence to generate a second SoftOut information sequence.

6. A method of iteratively decoding a sequence of received signals, representative of systematic convolutional encoded elements generated by a parallel-concatenated encoder from a source of original digital data elements, into decoded elements corresponding to the original digital data elements, the method comprising the steps of:

(a) providing a pair of decoder modules, each decoder module having a pair of received signal inputs, a feedback input, and an output, such that the output of each decoder module is coupled to the feedback input of each other decoder module;

(b) applying a received signal sequence to the received signal inputs of one decoder module and an interleaved received signal sequence to the received signal inputs of the other decoder module, such that each decoder module generates an output sequence;

(c) combining a feedback information sequence applied to each decoder module feedback input with its respective generated output sequence to provide a quantized reference sequence associated with each decoder module; and (d) applying each quantized reference sequence to a CRC word generator to generate a respective CRC word.

7. The method of iteratively decoding a sequence of received signals according to claim 6 further comprising the step of comparing the CRC word associated with each reference sequence with a previously stored CRC word generated via each respective CRC word generator to determine if each CRC word is identical with the associated previously stored CRC word.

8. The method of iteratively decoding a sequence of received signals according to claim 7 further comprising the step of generating substantially error-free decoded elements when the CRC words are both identical with their associated previously stored CRC words.

9. The method of iteratively decoding a sequence of received signals according to claim 8 wherein the step of generating substantially error-free decoded elements when the CRC words are both identical with their associated previously stored CRC words comprises the step of applying the combined received signal sequence, feedback information sequence and generated output sequence associated with one of the decoder modules to a summer element and quantizer element to generate a first decoded bit stream.

10. The method of iteratively decoding a sequence of received signals according to claim 9 wherein the step of generating substantially error-free decoded elements when the CRC words are both identical with their associated previously stored CRC words further comprises the step of applying the combined interleaved received signal sequence, feedback information sequence and generated output sequence associated with one of the other decoder module to a summer element and quantizer element to generate a second decoded bit stream.

11. The method of iteratively decoding a sequence of received signals according to claim 6 wherein the step (c) of combining a feedback information sequence applied to each decoder module feedback input with its respective generated output sequence comprises the step of applying the combined feedback information sequence and generated output sequence associated with each decoder module to a combined summer element and quantizer element associated with each decoder module respectively.

12. A CRC-based adaptive halting turbo decoder comprising:
- a first probability-based decoder having at least two received signal inputs, a feedback signal input and a signal output, the first probability-based decoder configured to receive an input information sequence and a convolved input information sequence;
- a second probability-based decoder having at least two received signal inputs, a feedback signal input and a signal output, such that the first probability-based decoder signal output is coupled to the second probability-based decoder feedback signal input, and further such that the second probability-based decoder signal output is coupled to the first probability-based decoder, the second probability-based decoder configured to receive an interleaved input information sequence and an interleaved convolved input information sequence;
- a first combinatorial element coupled to the first probability-based decoder and configured to generate a first reference sequence comprising a feedback information sequence and an output information sequence, both associated with the first probability-based decoder;
- a second combinatorial element coupled to the second probability-based decoder and configured to generate a second reference sequence comprising a feedback information sequence and an output information sequence, both associated with the second probability-based decoder;
- a first CRC word generator coupled to the first combinatorial element, the first CRC word generator configured to generate a CRC word associated with the first reference sequence;
- a second CRC word generator coupled to the second combinatorial element, the second CRC word generator configured to generate a CRC word associated with the second reference sequence;
- a data storage element in electrical communication with the first and second CRC word generators and configured to store the CRC words associated with the first and second CRC word generators;
- a first comparator in electrical communication with the first CRC word generator and the data storage element such that the first comparator can generate a turbo decoder halting signal when a CRC word newly generated in the first CRC word generator is identical with a previously stored CRC word generated in the first CRC word generator; and
- a second comparator in electrical communication with the second CRC word generator and the data storage element such that the second comparator can generate a turbo decoder halting signal when a CRC word newly generated in the second CRC word generator is identical with a previously stored CRC word generated in the second CRC word generator.

13. The CRC-based adaptive halting turbo decoder according to claim 12 further comprising a first quantizer coupled between the first combinatorial element and the first CRC word generator.

14. The CRC-based adaptive halting turbo decoder according to claim 13 further comprising a second quantizer coupled between the second combinatorial element and the second CRC word generator.

15. The CRC-based adaptive halting turbo decoder according to claim 14 further comprising a third combinatorial element coupled to the first combinatorial element, the first quantizer and a received signal input of the first probability-based decoder.

16. The CRC-based adaptive halting turbo decoder according to claim 15 further comprising a fourth combinatorial element coupled to the second combinatorial element, the second quantizer and a received signal input of the second probability-based decoder.

17. The CRC-based adaptive halting turbo decoder according to claim 16 further comprising a third quantizer coupled to the third combinatorial element to generate a first decoded bit sequence.

18. The CRC-based adaptive halting turbo decoder according to claim 17 further comprising a fourth quantizer coupled to the fourth combinatorial element to generate a second decoded bit sequence.

19. The CRC-based adaptive halting turbo decoder according to claim 12 further comprising a first scaler element coupled to the signal output of the first probability-based decoder and configured to scale a feedback signal to the second probability-based decoder.

20. The CRC-based adaptive halting turbo decoder according to claim 12 further comprising a second scaler element coupled to the signal output of the second probability-based decoder and configured to scale a feedback signal to the first probability-based decoder.

21. A CRC-based adaptive halting turbo decoder comprising:
- a first probability-based MAP decoder having two received signal inputs, a feedback input and an output;
- a second probability-based MAP decoder having two received signal inputs, a feedback input and an output;
- a first scaler element having an output and further having an input coupled to the output of the first probability-based MAP decoder;
- a first interleaver having an input coupled to the output of the first scaler and further having an output coupled to the feedback input of the second probability-based MAP decoder;
- a second scaler element having an output and further having an input coupled to the output of the second probability-based MAP decoder;
- a first de-interleaver having an input coupled to the output of the second scaler element and further having an output coupled to the feedback input of the first probability-based MAP decoder;
- a first combinatorial element having an output and further having a first input coupled to the feedback input of the first probability-based MAP decoder and further having a second input coupled to the output of the first probability-based MAP decoder;
- a second combinatorial element having an output and further having a first input coupled to the feedback input of the second probability-based MAP decoder and further having a second input coupled to the output of the second probability-based MAP decoder;
- a first quantizer having an input coupled to the output of the first combinatorial element and further having an output;

a second quantizer having an input coupled to the output of the second combinatorial element and further having an output;

a first CRC word generator having an input coupled to the output of the first quantizer and further having an output;

a second CRC word generator having an input coupled to the output of the second quantizer and further having an output;

a first comparator having a first input selectively coupled to the output of the first CRC word generator and further having an output; and a second comparator having a first input selectively coupled to the output of the second CRC word generator and further having an output.

22. The CRC-based adaptive halting turbo decoder of claim 21 further comprising a first storage unit having an input selectively coupled to the output of the first CRC word generator and further having an output coupled to the first comparator.

23. The CRC-based adaptive halting turbo decoder of claim 22 further comprising a second storage unit having an input selectively coupled to the output of the second CRC word generator and further having an output coupled to the second comparator.

24. The CRC-based adaptive halting turbo decoder of claim 23 further comprising a third combinatorial element having a first input coupled to the output of the first combinatorial element and further having a second input coupled to a received signal input of the first probability-based decoder.

25. The CRC-based adaptive halting turbo decoder of claim 24 further comprising a fourth combinatorial element having a first input coupled to the output of the second combinatorial element and further having a second input coupled to a received signal input of the second probability-based decoder.

26. The CRC-based adaptive halting turbo decoder of claim 25 further comprising a third quantizer having an input coupled to the output of the third combinatorial element and further having an output.

27. The CRC-based adaptive halting turbo decoder of claim 26 further comprising a fourth quantizer having an input coupled to the output of the fourth combinatorial element and further having an output.

28. The CRC-based adaptive halting turbo decoder of claim 27 further comprising a second de-interleaver having an input coupled to the output of the fourth quantizer and further having an output.

29. A CRC-based adaptive halting turbo decoder comprising:

a turbo decoder configured to receive an input sequence, a convolved input sequence and an interleaved convolved input sequence, and a pair of CRC word generators coupled to the turbo decoder and configured to generate CRC words, the CRC words associated with the input sequence, convolved input sequence and interleaved convolved input sequence, and a pair of comparators, each comparator coupled to a distinct one of the CRC word generators and configured to compare newly generated CRC words with CRC words previously stored therein to generate decoder halting signals.

* * * * *